(12) United States Patent
Gonska et al.

(10) Patent No.: US 8,975,118 B2
(45) Date of Patent: Mar. 10, 2015

(54) COMPONENT HAVING A VIA AND METHOD FOR MANUFACTURING IT

(75) Inventors: Julian Gonska, Reutlingen (DE); Jens Frey, Filderstadt (DE); Heribert Weber, Nuertingen (DE); Eckhard Graf, Gomaringen (DE); Roman Schlosser, Waldkirch (DE)

(73) Assignee: Robert Bosch GmbH, Stuttgart (DE)

( * ) Notice: Subject to any disclaimer, the term of this patent is extended or adjusted under 35 U.S.C. 154(b) by 8 days.

(21) Appl. No.: 13/701,277

(22) PCT Filed: Apr. 13, 2011

(86) PCT No.: PCT/EP2011/055825
§ 371 (c)(1),
(2), (4) Date: Feb. 20, 2013

(87) PCT Pub. No.: WO2011/151098
PCT Pub. Date: Dec. 8, 2011

(65) Prior Publication Data
US 2013/0147020 A1    Jun. 13, 2013

(30) Foreign Application Priority Data

May 31, 2010    (DE) .......................... 10 2010 029 504

(51) Int. Cl.
*H01L 27/088*    (2006.01)
*H01L 23/48*    (2006.01)
(Continued)

(52) U.S. Cl.
CPC .......... *H01L 23/481* (2013.01); *B81C 1/00095* (2013.01); *H01L 21/76837* (2013.01); *B81B 2203/033* (2013.01); *B81B 2207/095* (2013.01); *H01L 2224/48463* (2013.01)

USPC ............... 438/123; 438/53; 438/51; 438/643; 257/417; 257/738; 257/59; 257/72; 257/690; 257/E21.476; 257/E27.111; 257/E21.705

(58) Field of Classification Search
CPC ............ B81B 7/0006; H01L 21/76898; H01L 23/3114; H01L 23/481; H01L 21/76801–21/76831
USPC .......... 257/621, 419, 416, 417, 254, E21.476, 257/E27.111, E21.495; 438/53, 643, 51, 438/612, 638, 123, 106, 667
See application file for complete search history.

(56) References Cited

U.S. PATENT DOCUMENTS

2004/0245586 A1    12/2004    Partridge et al.
2005/0163968 A1    7/2005    Hanket
(Continued)

FOREIGN PATENT DOCUMENTS

DE    10 2008 025599    1/2009
DE    10 2009 041463    4/2010
(Continued)

*Primary Examiner* — Jerome Jackson, Jr.
*Assistant Examiner* — Bo Fan
(74) *Attorney, Agent, or Firm* — Kenyon & Kenyon LLP (57) ABSTRACT

An advantageous method and system for realizing electrically very reliable and mechanically extremely stable vias for components whose functionality is realized in a layer construction on a conductive substrate. The via (Vertical Interconnect Access), which is led to the back side of the component and which is used for the electrical contacting of functional elements realized in the layer construction, includes a connection area in the substrate that extends over the entire thickness of the substrate and is electrically insulated from the adjoining substrate by a trench-like insulating frame likewise extending over the entire substrate thickness. According to the present system, the trench-like insulating frame is filled up with an electrically insulating polymer.

5 Claims, 12 Drawing Sheets (51) Int. Cl.
  *B81C 1/00* (2006.01)
  *H01L 21/768* (2006.01)

(56) References Cited

U.S. PATENT DOCUMENTS

2008/0157361 A1 * 7/2008 Wood et al. .................. 257/738
2009/0061620 A1 * 3/2009 Tsukamoto et al. .......... 438/643

FOREIGN PATENT DOCUMENTS

| EP | 1 671 924 | 6/2006 |
| JP | 7-333078 | 12/1995 |
| JP | 2009-226571 | 10/2009 |
| WO | 2008 131981 | 11/2008 |

* cited by examiner

COMPONENT HAVING A VIA AND METHOD FOR MANUFACTURING IT

FIELD OF THE INVENTION

The present invention relates to a component whose functionality is realized in a layer construction on a conductive substrate, having at least one via (Vertical Interconnect Access), led to the back side of the component, for the electrical contacting of functional elements realized in the layer construction. The via includes a connection area in the substrate that extends over the entire thickness of the substrate, and is electrically insulated from the adjoining substrate by a trench-like insulating frame likewise extending over the entire substrate thickness. The present invention further relates to a method for manufacturing a component having such a via. In addition, the present invention relates to a component having functional elements which are realized in a layer construction on a substrate, and having a conductive cap substrate on the layer construction.

BACKGROUND INFORMATION

It is believed to be understood to lead electrical contactings through a wafer or a partial area of a wafer. This type of contacting is used, for example, in the case of components which are intended for flip-chip mounting. However, vias also permit three-dimensional packaging designs, where several components are superposed vertically and contacted. Therefore, vias are gaining increasing importance.

In the European Patent Application EP 1 671 924 A2, a micromechanical sensor element of the type indicated at the outset is discussed, whose micromechanical structural elements are realized in a functional layer of the layer construction. They are engaging interdigital structures having fixed and deflectable electrodes. For the electrical connection of these electrodes, conductor tracks are integrated into the layer construction between the substrate and the patterned functional layer. These conductor tracks are each in direct contact with a substrate connection area forming a via. Each connection area is completely surrounded by trenches which were produced in the substrate by a back-side trenching process after completion of the layer construction, and extend over the entire thickness of the substrate. These trenches form an insulating frame which electrically insulates the connection area from the adjoining substrate. The insulating frame of the vias discussed in EP 1 671 924 A2 is filled superficially at best, and specifically, with the material of an insulating layer which is applied on the back side of the substrate and patterned after the back-side trenching process and prior to a metallization, so that the metallization is connected with the connection area.

In practice, this realization form of a via proves to be problematic in two respects. First of all, the insulating properties of open trenches are indefinite. For example, these properties may be impaired by contamination during the manufacturing or dicing process or perhaps at the location the component is used, so that the electrical reliability of the via suffers. Secondly, the mechanical stability of vias having an open insulating frame is essentially a function of its geometry, i.e., its form, depth and width. However, the mechanical stability of a via must always satisfy the same minimum requirements for an external contacting by wire bonding, for example.

SUMMARY OF THE INVENTION

With the present invention, an advantageous possibility is provided for realizing vias that are electrically very reliable and mechanically stable for components of the type indicated at the outset.

The intended electrical reliability and mechanical stability of the vias are achieved according to the present invention by filling up the trench-like insulating frame with an electrically insulating polymer.

According to the present invention, it was recognized, first of all, that sufficient mechanical stability of the known vias can be attained most easily by filling up the insulating frame. With regard to the mounting of the components under discussion here, care must be taken that to the greatest extent possible, the back side of the component is also free of topography in the area of the vias. In addition, the filling should be as free from shrink holes as possible in order to achieve optimal electrical insulation of the via. The fill material and filling process are to be selected so that the area surrounding the via also does not become contaminated at average temperatures.

According to the present invention, it was then recognized that electrically insulating polymers, both because of their electrical and mechanical properties and on the basis of the methods available for filling trenches with a high aspect ratio, are particularly well-suited for insulating the known vias.

Taking the inventive idea explained above as a basis, it is furthermore proposed to realize such a via in the conductive cap substrate of a suitably furnished component, so that this component is able to be contacted via its cap.

At this point, BCB (benzocyclobutene), ALX-211 polymers of the firm Asahi, polyimides and PBO (polyphenylene-2,6-benzobisoxazole) as well as their layer combinations can be named as especially suitable polymers. These materials may easily be applied to the back side of the substrate by spinning or spraying under vacuum conditions, in doing which, trenches such as insulating frames are gradually filled up.

These materials exhibit very good dielectric properties. Since after hardening, they are temperature-stable and also moisture-resistant, they are well-suited for use in the automotive field. Their use proves to be advantageous in the course of the manufacturing process as well, since they allow complete filling of the isolation trenches in a manner that is free of shrink holes, are vacuum-suitable and permit good wetting for a resist coating. In addition, these materials possess an adapted, thermally controllable viscosity.

Because of the polymer filling of the insulating frame, the via exhibits sufficient mechanical stability in all three spatial directions, which permits direct wire bonding on the metal-plated surface of the via. This is beneficial in terms of a space-saving component structure and facilitates a compact assembly. In this connection, it additionally proves to be advantageous that the topography of the component back side is typically less than 1-10 μm in the area around the via.

The thermal mismatch of silicon (CTE=$3*10^{-6}K^{-1}$) and a polymer (CTE=$60*10^{-6}K^{-1}$) used to fill up the insulating frame has a negative effect on the mechanical stability of the silicon vias. In order to increase the mechanical stability of the vias according to the present invention, the thermal expansion (CTE) of polymer materials may be reduced by adding suitable fillers to the polymer base material. $SiO_2$ nanoparticles or metal oxide particles are especially suitable for this purpose. In this way, polymer materials may also be synthesized which exhibit a negative thermal expansion in order to realize especially low CTEs. In this context, high filling ratios and filler blends with defined particle-size distribution as well as good workability of the composite material must be ensured.

In principle, components according to the present invention may be realized with vias in any form, geometry and configuration. It is especially advantageous in terms of mechanical robustness if the insulating frame of the via has a rounded geometry, in particular, is cylindrical. Cylindrical vias have the advantage that they have the smallest parasitic capacitances relative to the substrate or relative to adjacent vias.

Furthermore, the mechanical stability of the via may be increased by an additional anchoring of the polymer filling in the insulating frame. To that end, the insulating frame is expanded in the area of the middle and/or its base point by proportional isotropic deep-etching. The trench geometry resulting in the middle area and/or at the base point brings about a very good mechanical stress decoupling in the transition region between the substrate and the layer construction. Particularly in the case of insulating frames having a radial geometry, the mechanical stresses are distributed uniformly in the interface between the substrate and the layer construction.

Using the technology described above, vias having a contact resistance of 2-100 Ohm may be realized particularly advantageously. To that end, the substrate material may be heavily doped in the connection area. Advantageously, the via is connected to a conductor track, implemented in the layer construction, which may be realized, for example, in the form of a suitably doped and patterned polysilicon layer. In one especially advantageous specific embodiment of the present invention, the contact surface of the mechanical connection between the substrate material in the connection area, thus, the via, and the buried polysilicon conductor track is enlarged by patterning the substrate surface in this area prior to applying the polysilicon, thus, for example, by providing it with steps or beads. Such structures contribute advantageously to the reinforcement, stabilization and anchoring of the foundation or base of the via, as well.

Moreover, in one specific embodiment of the present invention, the via is connected to a metallization, applied on the back side of the component, in which a terminal pad is formed for the external contacting. This terminal pad may be positioned directly on the vertical via or, with the aid of a rewiring, at another location on the back side of the component. The contact variant with rewiring offers a higher degree of freedom in positioning the terminal pad, which, for example, may be utilized in the case of flip-chip mounting or when stacking components one upon the other.

It is significant that the via concept according to the present invention is suitable both for pure IC components and for micromechanical components and MEMS, so long as their functionality is realized in a layer construction on a conductive substrate, or the component structure includes a conductive cap substrate in which the via is realized.

To that end, within the course of processing the front side during the manufacturing process, at least one conductor track is implemented in the layer construction on the semiconductor substrate, and is in direct contact with a connection area in the substrate on one hand, and on the other hand, produces an electrical connection to at least one functional element to be realized in the layer construction. The back side of the component is processed only after the completion of the layer construction with the functionality of the component and after capping with the capping substrate. Within the course of this back-side processing, an insulating frame surrounding the connection area and extending over the entire substrate thickness (typically 50-300 µm) is then produced in the substrate. According to the present invention, this trench-like insulating frame is filled up—as completely as possible—with an electrically insulating polymer. In addition, on the back side of the component, a metallization is applied which is connected to the connection area and in which a terminal pad is formed for the external contacting of the component.

The joining of the semiconductor substrate and the buried conductor track over a large area, the support of the polymer filling and the type of polymer ensure maximum mechanical stability of the via.

In one especially advantageous method variation, the metallization is applied on the back side of the component prior to the back-side trenching process, and is patterned in such a way that it forms an etching mask for the back-side trenching process. Thus, initially the patterned metallization is used here as an extremely selective trench mask for a high-aspect trenching process that permits precise trench etchings for aspect ratios above 1/40. The etching of insulating frames in the case of a moderate aspect ratio of typically 1/20 may be carried out using the familiar photoresist technique.

Since the insulating frame is not filled up until at the end of the back-side process, if no more steps are carried out at high temperature, then such high demands no longer must be placed on the thermal resistance of the filling material. This method variant is compatible with the familiar MEMS and CMOS processes. Since neither the trenching process nor the closing of the insulating frame require high process temperatures, components having temperature-sensitive functional elements may also be provided later with vias as described here.

In addition, it is especially advantageous that when using this method variant, a large process window is available for the trench-etching of the insulating frame and the filling of the insulating frame, since only moderate feature widths are necessary, and very wide trenches, typically 5-30 µm, are able to be closed using suitable filling methods.

As already described above, there are various options for developing and further refining the teaching of the present invention in an advantageous manner. In this regard, reference is made on one hand to the claims subordinate to the independent claims and, on the other hand, to the following description of two exemplary embodiments of the present invention with the aid of the figures.

DETAILED DESCRIPTION

Figure 1A:
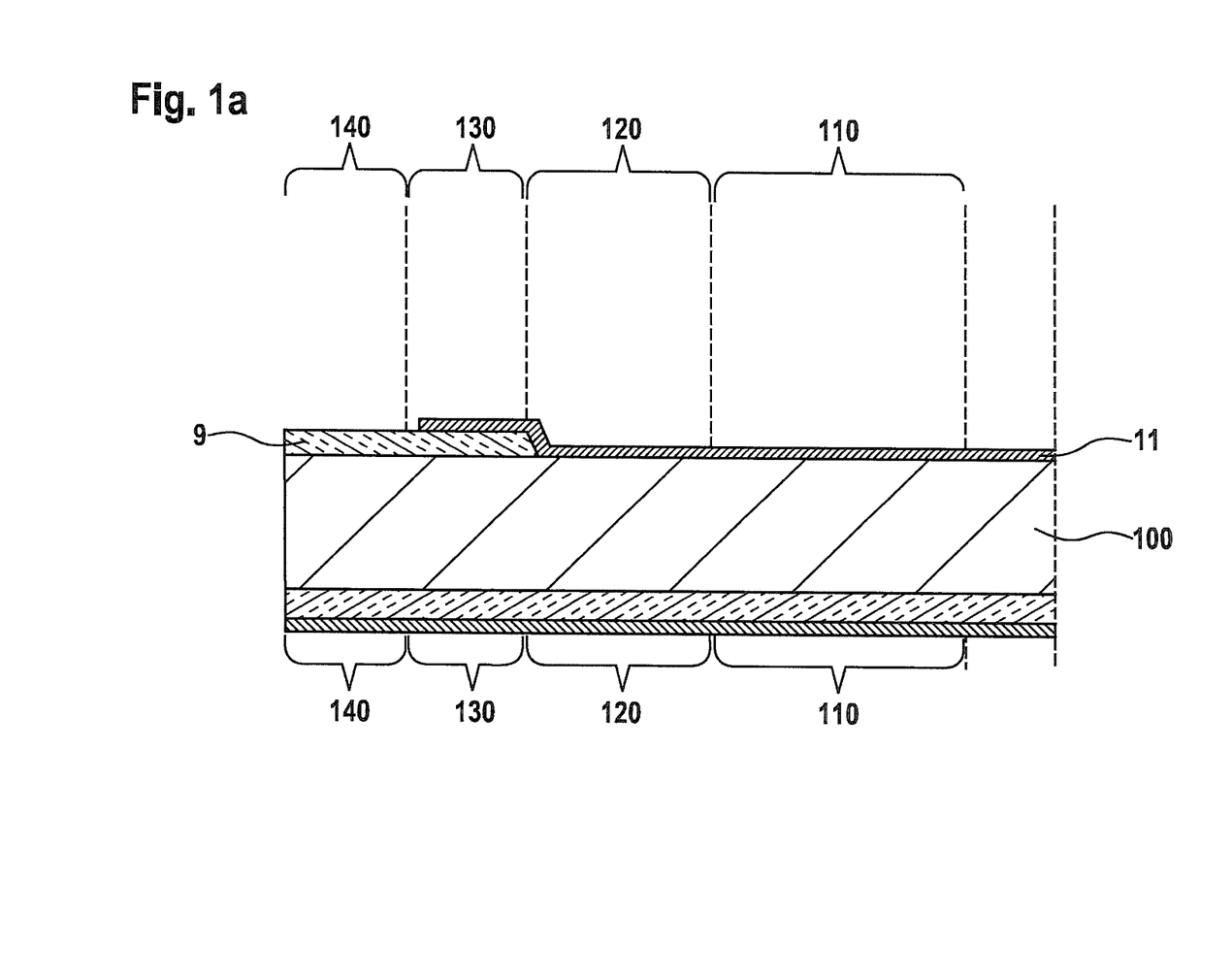
FIGS. 1a, 1b, 1c, 1d, 1e, and 1f illustrate the manufacture of a component according to the present invention on the basis of schematic sectional views of the component structure in the area of a via, in successive stages of the manufacturing process.

The method for manufacturing a component of the type under discussion here starts out from what may be a heavily doped semiconductor substrate 100, as shown in FIG. 1a. In the course of processing the front side, initially a dielectric layer 9 is produced on the substrate surface. To that end, for example, a TEOS layer is deposited or SiO2 is oxidized to higher valency. In the course of patterning dielectric layer 9, it is opened in the areas in which a contact is to be produced to substrate 100, and specifically, in the areas of a via yet to be produced and a bonding frame, which are denoted by 120 and 110 in FIG. 1a. The contact is produced with the aid of one or more conductor tracks 11. They may be realized in a polysilicon layer 11 which, for example, is deposited on patterned dielectric layer 9 in a LPCVD process. To improve the mechanical joining between substrate 100 and polysilicon layer 11 in area 120, prior to depositing the polysilicon, for example, concentrically running steps, so-called beads, may be etched in this area 120, for instance.

In the exemplary embodiment described here, polysilicon layer 11 is then patterned in such a way that area 120 of the via yet to be produced and area 110 of the bonding frame remain electrically interconnected, and after the surface of the functional layer has been planarized, an advantageous topography is obtained. In addition, in polysilicon layer 11, a contact area 130 is patterned out for a micromechanical sensor structure yet to be produced in a sensor area 140 of the component.

Figure 1B:
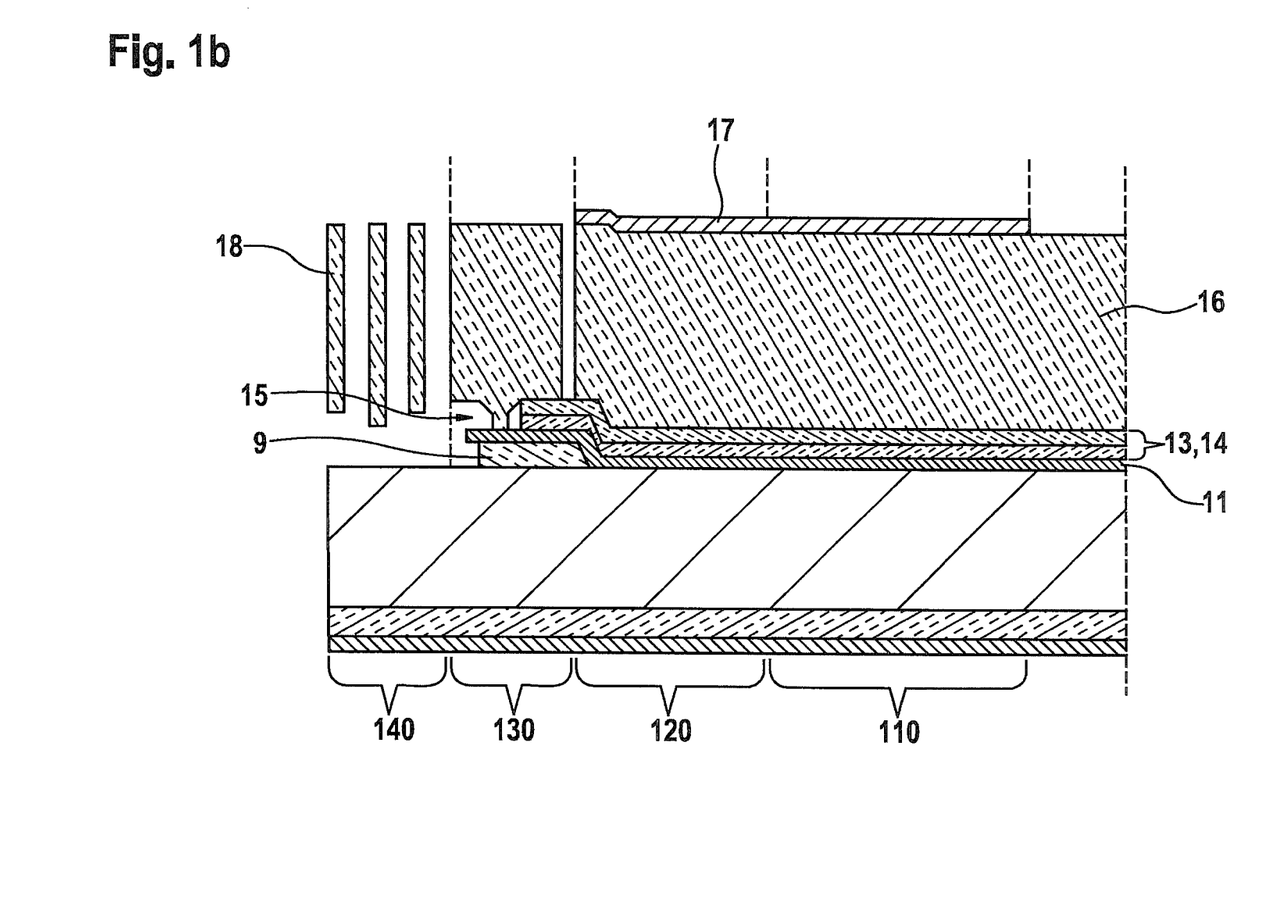

FIG. 1b shows the layer construction after one or perhaps several dielectric layers 13, 14 have been deposited over polysilicon conductor-track layer 11, and in the course of patterning these layers 13, 14, a contact opening 15 has been produced in contact area 130, the contact opening leading to buried conductor track 11. In a familiar surface-micromechanical process sequence, a micromechanical sensor structure 18 was then produced in a functional layer 16 of the layer construction. This sensor structure 18 is connected to conductor track 11 via contact opening 15. Finally, in the exemplary embodiment described here, in the areas of bonding frame 110 and via 120, a metallization 17 was also applied on functional layer 16.

Figure 1C:
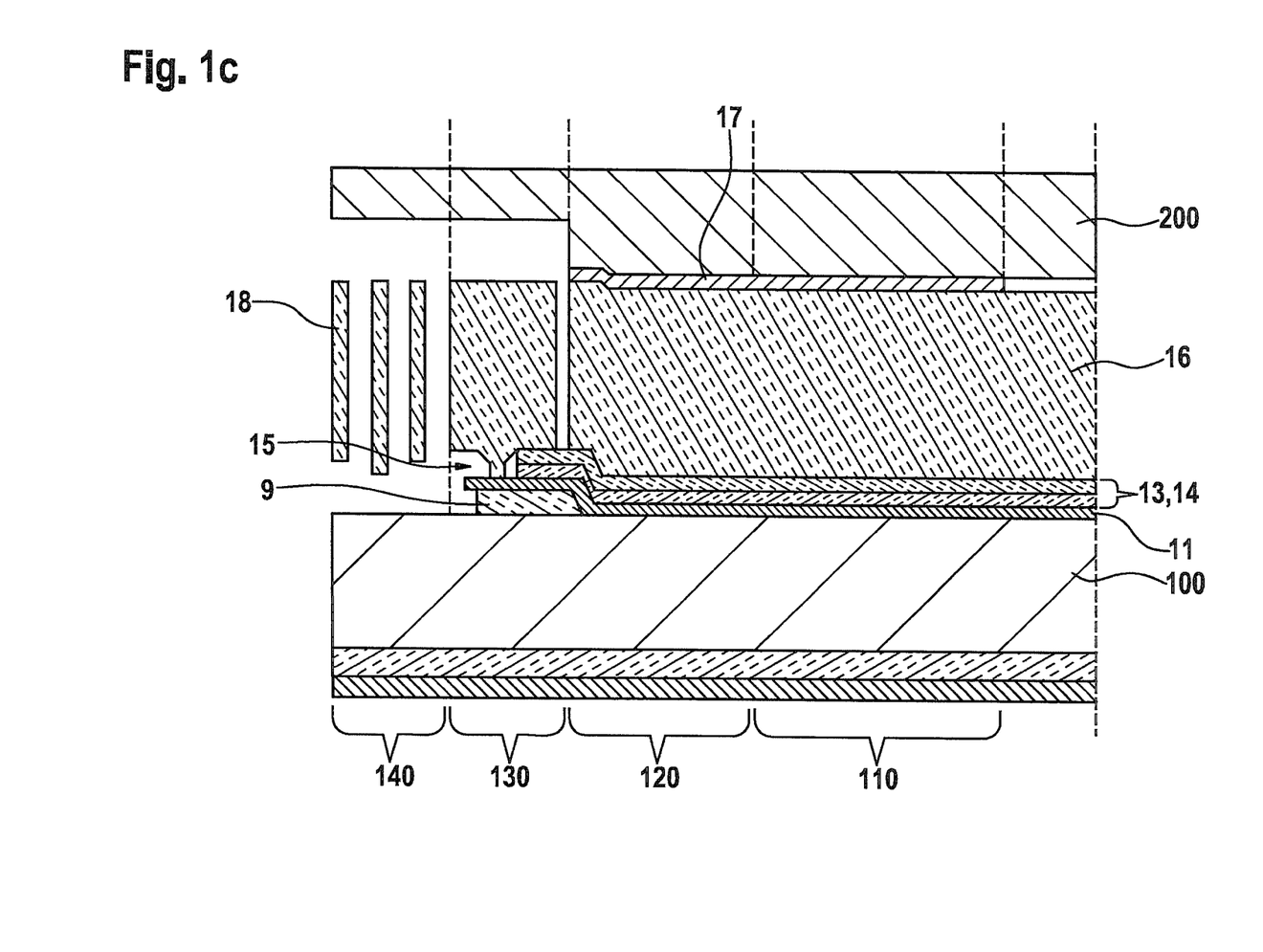

Metallization 17 is used as bonding metal for mounting a cap wafer 200 over sensor structure 18 with the aid of eutectic bonding. However, any other wafer bonding technique may be used for mounting cap wafer 200, as well. As FIG. 1c shows clearly, cap wafer 200 and sensor structure 18 of the component must be aligned precisely relative to each other.

They are also electrically connected to each other by way of eutectically bonded metallization 17. The front-side processing of the component is concluded with the mounting of cap wafer 200.

Within the course of the back-side processing now following, first of all, the back side of substrate 100 is thinned. Available methods such as grinding, chemical etching, dry etching and/or chemical-mechanical polishing are utilized for that purpose. Typically, in so doing, substrate 100 is thinned to a thickness of 50 to 300 µm. The thickness of substrate 100 is determined particularly by the mechanical stability aimed at for the component and the maximum possible depth of the trenches to be produced subsequently for the vias.

The via or the insulating frame of the via must be positioned in alignment with buried conductor track 11. To that end, alignment marks are transferred to the back side of the substrate, e.g., with the aid of infrared alignment with respect to metallization 17 in area 120.

Figure 1D:
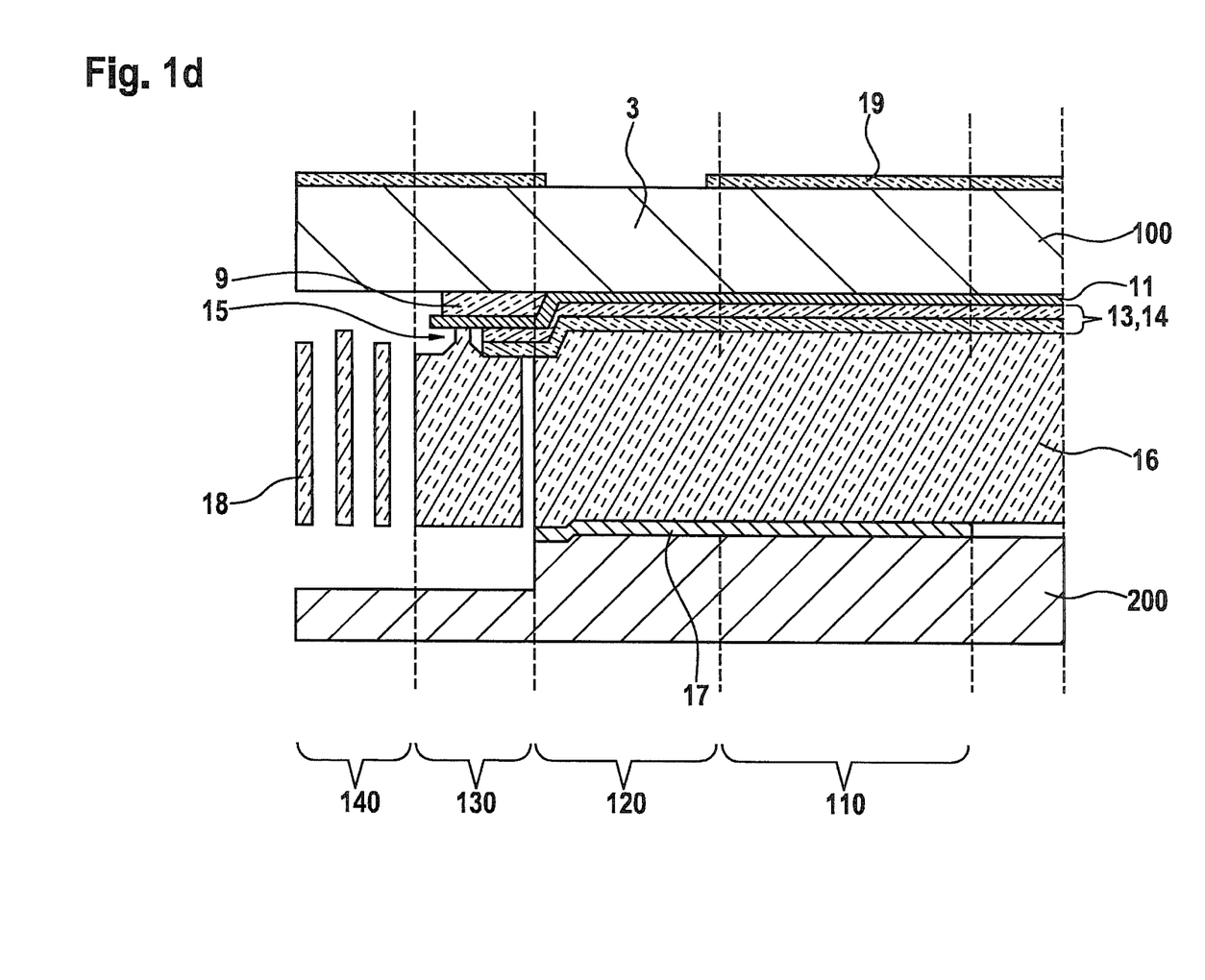

In the exemplary embodiment described here, a dielectric intermediate layer 19 is now applied on the back side of the substrate and opened in marked area 120 of via 3 to be produced. It may be a thin CVD or polymer layer having a thickness of 100 nm to 1000 nm. This situation is shown in FIG. 1d.

Over dielectric intermediate layer 19 thus patterned, a metal layer 5 is deposited and patterned. Since the terminal pads for the external contacting of the component or of sensor structure 18 are implemented in metal layer 5, a metal able to be wire-bonded, which may be Al, AlSi, AlCu, AlSiCu, TiN as well as other precious and semiprecious metals, is used here. In addition, metal layer 5 may be used here, together with dielectric intermediate layer 19, as mask for the subsequent anisotropic trenching process, in which insulating frame 2 for via 3 is produced in substrate 100. Therefore, metal layer 5 is completely or at least partially opened over trenches 2 to be produced. If the intention is to position the terminal pad directly on the via to be produced, metal layer 5 may be opened over the entire peripheral insulating frame. Alternatively, resist mask 22 may cover metal layer 5 and be used for patterning dielectric intermediate layer 19 and substrate 100. However, if the intention is to carry out a rewiring, that is, if the terminal pad is to be disposed laterally with respect to the via on the substrate back side, then when patterning metal layer 5, expediently at least one rib leading outward remains as electrical connection to the terminal pad situated outside of the insulating frame. The proportions of such ribs and the process parameters for the etching and passivation steps of the trenching process are selected in such a way that the ribs in patterned metal layer 5 are completely undercut. Alternatively, the undercutting may also be carried out in a subsequent isotropic etching step.

Insulating frame 2 was produced here in a multi-step trenching process. By a combination of anisotropic and longer isotropic etching steps at defined depth of insulating frame 2, pocket-like expansions for anchoring polymer 21 in insulating frame 2 were produced at base point 20 and in middle area 24.

Etching and rounding by proportional isotropic deep etching of dielectric layers 9, 13, 14 additionally provides an anchoring for polymer filling 21 at base 20 of insulating frame 2, and therefore for via 3. A resist mask 22 was used to protect the remaining metal-free substrate areas.

Figure 1E:
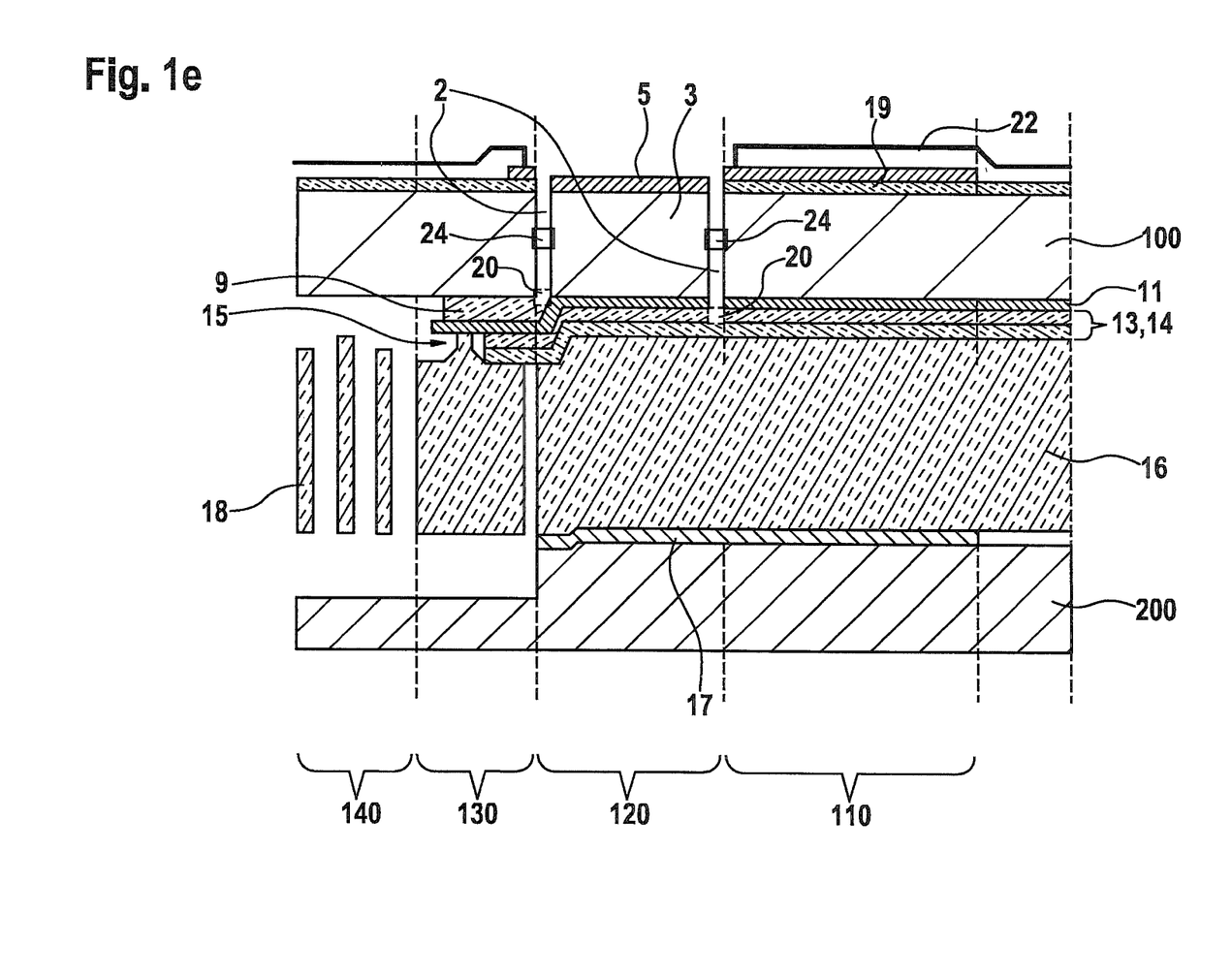

FIG. 1e shows the component structure after the back-side trenching process, and illustrates that insulating frame 2 extends over the entire thickness of substrate 100 into dielectric layer 9 or dielectric layers 13, 14, which also serve as etch stop. In this manner, a connection area of heavily doped substrate 100 is electrically isolated from the adjoining substrate material, and thus forms a via 3 which is connected to sensor structure 18 by way of conductor track 11.

According to the present invention, insulating frame 2 is now filled up with an electrically insulating polymer such as BCB.

Figure 1F:
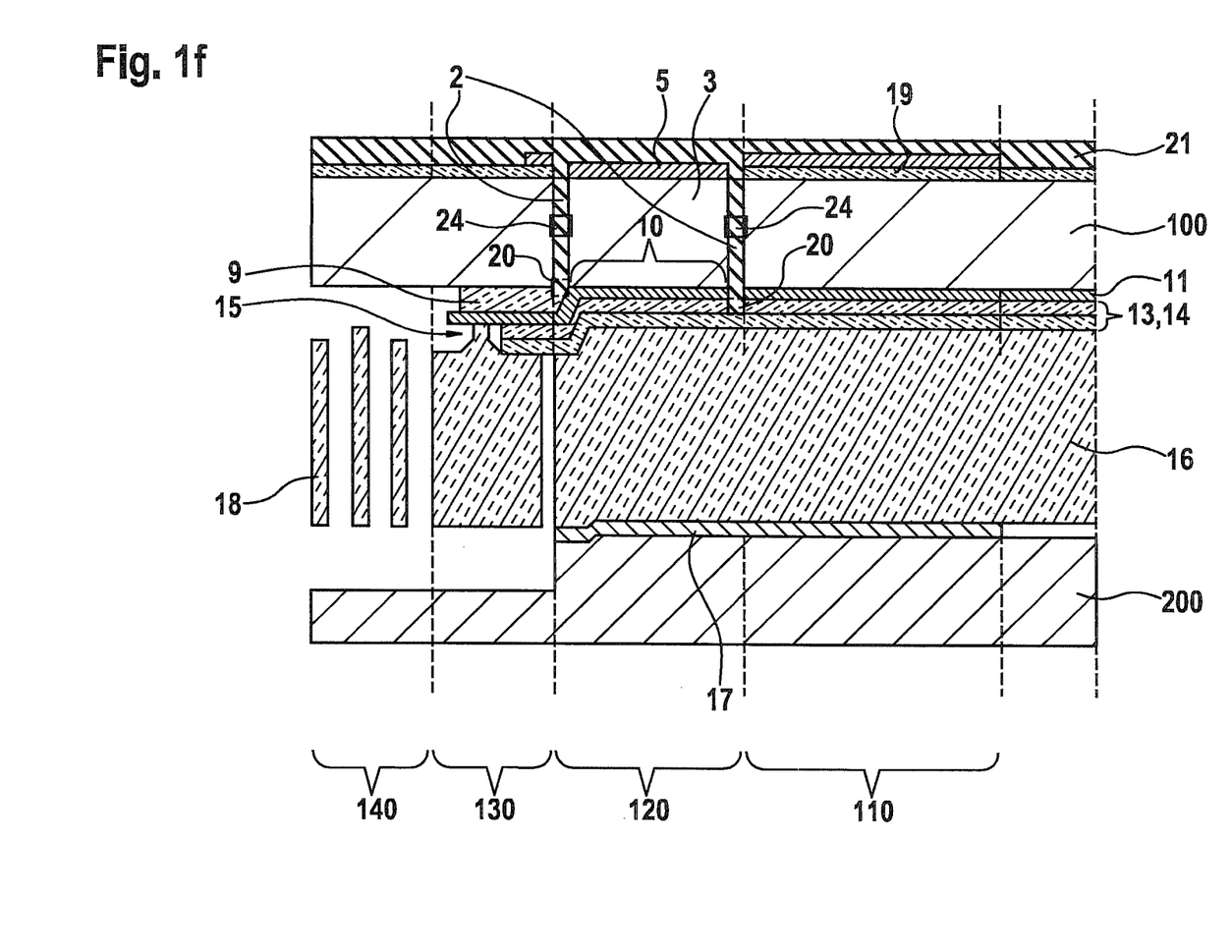

To that end, a suitable polymer layer 21 is applied under vacuum conditions by spinning or spraying. In so doing, insulating frame 2 is progressively filled up. The thickness of polymer layer 21 is selected in such a way that the largest openings or cavities in trench 2 up to a width of 30 µm are completely closed. Insulating frame 2 may be filled in such a way that the entire layer construction having dielectric layers, silicon and polymer filling of the component has an adapted thermal expansion (CTE). The stability of this polymer closure shown in FIG. 1f increases if there are no entrapments present and if contact area 10 between via 3, i.e., the connection area of substrate 100, and buried conductor track 100 is as large as possible. Polymer filling 21 is especially well-anchored here by pocket-like expansions 20 and 24 of trench 2.

Finally, the contact or bonding areas of via 3 are opened, e.g., by all-over backthinning of polymer layer 21 or by photopatterning in the region of the bonding areas.

At this point, it should be noted that after filling insulating frame 2, in principle, further processing steps may also be carried out on the front side and/or back side of the component.

As an alternative to the back-side process described above, the possibility also exists of producing the isolation trenches prior to applying a back-side metallization and to fill it with a polymer. The back side of the component may then still be planarized before further layers are applied to realize the terminal pads. Methods such as fine grinding or mechanical/chemical polishing may be used for the planarization process.

Figure 2:
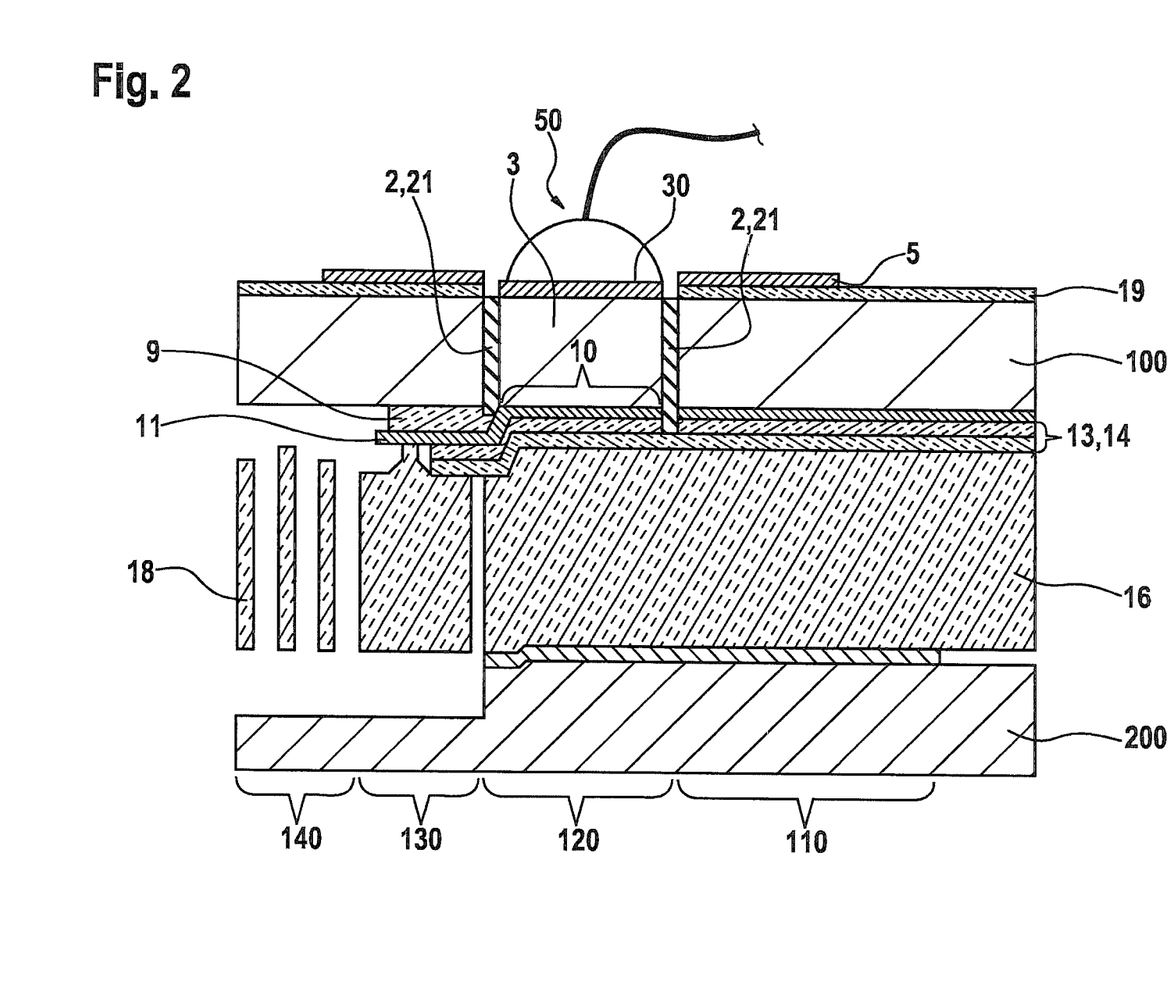
FIG. 2 shows a schematic sectional view of the component thus produced in the area of a via with wire bond positioned directly on the via.

FIG. 2 shows the result of the manufacturing process described above, in the form of a component. It is an acceleration sensor element whose micromechanical functional elements 18 have been realized in the layer construction on semiconductor substrate 100. Micromechanical functional elements 18 are protected by cap wafer 200 which, for example, has been mounted by eutectic bonding on the layer construction of the component. Micromechanical functional elements 18 are electrically contacted via buried conductor track 11, which is electrically insulated by dielectric layers 9 and 13, 14 from heavily doped semiconductor substrate 100 on one hand, and from functional layer 16 having functional elements 18 on the other hand. Conductor track 11 produces a connection between micromechanical functional elements 18 and a connection area 3 of substrate 100, which is isolated from the adjoining substrate material by a cylindrical insulating frame 2, and forms the via. In areas 120 and 110, the base of functional layer 16 has an, at most, very low (<500 nm) topography. As a result, the metallization in this area is also virtually free of topography, which is a prerequisite for a hermetically sealed eutectic bond to cap wafer 200.

According to the present invention, insulating frame 2 is filled with a dielectric polymer 21. On the back side of the substrate is a patterned metallization 5, which is in direct contact with connection area 3, but otherwise is electrically insulated from substrate 100 by a dielectric layer 19. Terminal pad 30 for the external contacting of the component, i.e., of functional elements 18, is positioned here directly on connection area 3 which, because of polymer filling 21, is mechanically stabilized to the extent that a direct wire bonding 50 on via 3 is possible, which is illustrated in FIG. 2. Metallization 5 is patterned here in such a way that terminal pad 30 is insularly separated from the remainder of metallization 5. Metallization 5 lying outside of the pad area is used as mask for the trenching process to produce the insulating frame. This metallization is not necessary when, because of a lower aspect ratio, a resist mask may also be used.

Figure 3A:
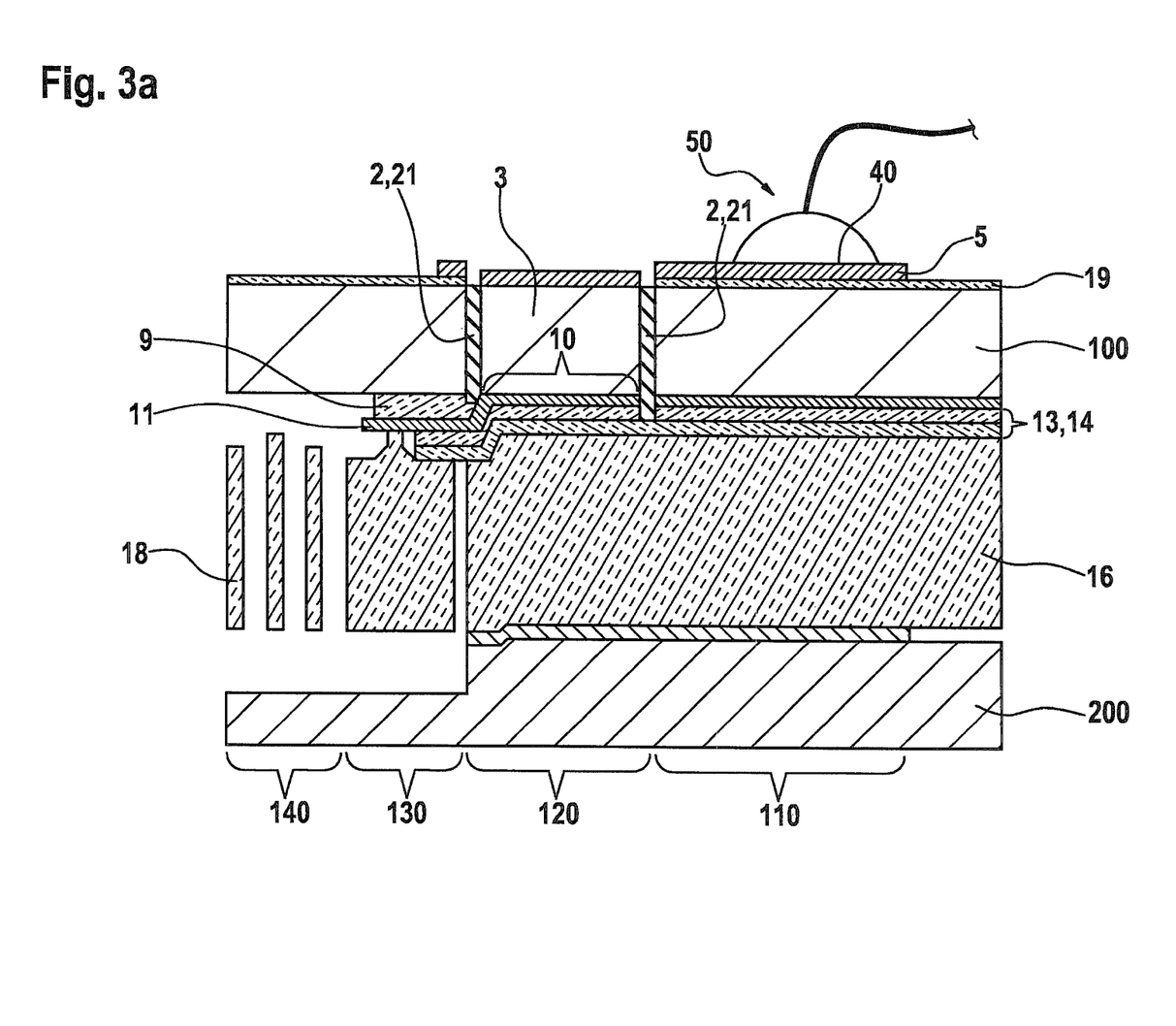
FIG. 3a shows a schematic sectional view of a further component thus produced in the area of a via with rewiring and FIG. 3b shows a top view of the connection metallization of this component.

The same reference numerals are used in FIG. 3a as in FIG. 2, since the two components shown here are identically constructed. They differ only in the patterning of metallization 5, that is, in the positioning of the terminal pad for the external contacting.

Figure 3B:
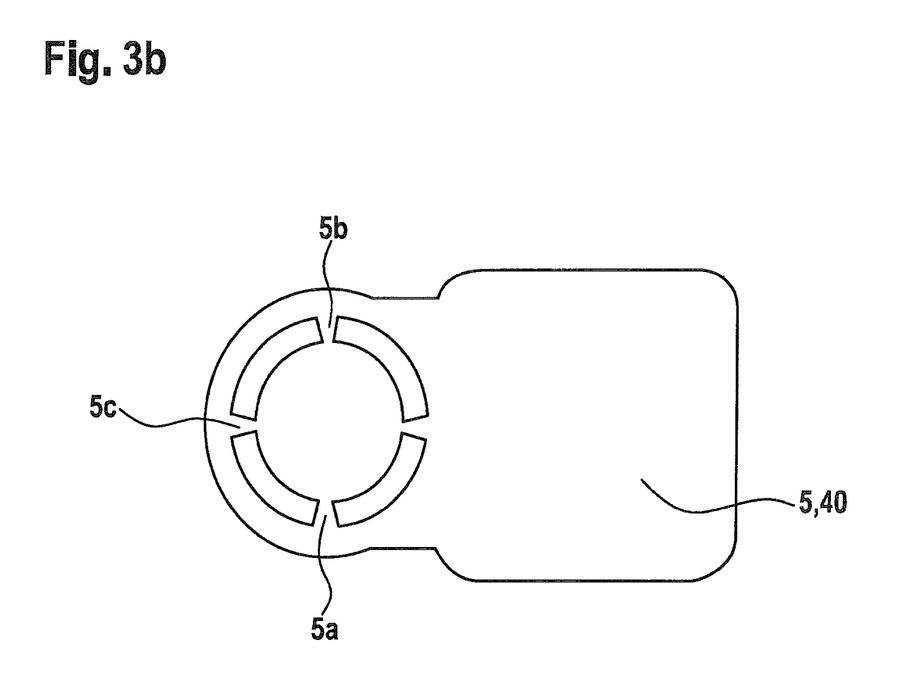

While in the case of FIG. 2, terminal pad 30 is positioned directly on via 3, terminal pad 40 of the component shown in FIG. 3a is disposed to the side of via 3. Accordingly, wire bonding 50 is also to the side of via 3. In order to realize terminal pad 40 to the side of via 3, a rewiring was necessary, which is illustrated by FIG. 3b. The area of metallization 5 which is in direct contact with connection area 3 is still connected here to the metallization of terminal pad 40 by way of ribs 5a, 5b, 5c. In principle, only one rib is also sufficient for the connection between via and terminal pad.

Figure 4A:
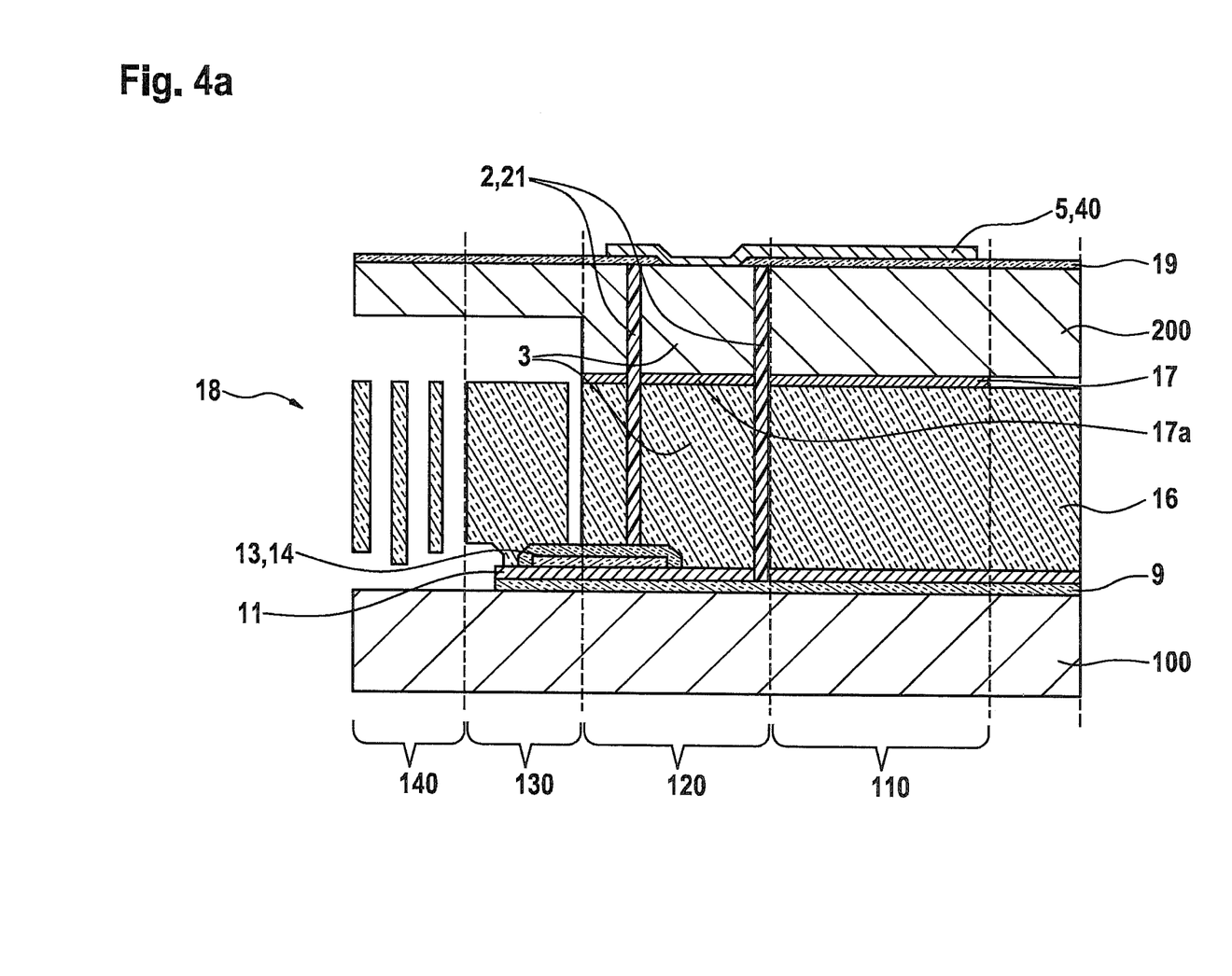
FIG. 4a shows a schematic sectional view of a component according to the present invention, with conductive cap wafer in the area of a via through this cap wafer.

As already mentioned, the via explained in great detail above may also be realized within what may be a heavily doped cap wafer. An example for this variant of the present invention is shown in FIG. 4a.

It is likewise an acceleration sensor element whose micromechanical functional elements 18 have been realized in a layer construction on a semiconductor substrate 100. Micromechanical functional elements 18 are protected by a cap wafer 200 made of a conductive material. This cap wafer 200 was bonded by a metallization 17, 17a in areas 110 of the bonding frame and 120 of the via onto the layer construction of the component. Micromechanical functional elements 18 are electrically contacted by way of one or more buried conductor tracks 11, which are electrically insulated by dielectric layers 9 and 13, 14 from heavily doped semiconductor substrate 100 on one hand, and from functional layer 16 on the other hand. Conductor track 11 produces a connection between micromechanical functional elements 18 and a connection area 3 that extends over functional layer 16, metallization 17a and cap wafer 200 and is insulated from the adjoining layer material by a cylindrical insulating frame 2. According to the present invention, insulating frame 2 is filled with a dielectric polymer 21.

Insulating frame 2 may be produced in a one-step trenching process after cap wafer 200 has been bonded on. In this case, it is advisable to pattern metallization 17, 17a appropriately before cap wafer 200 is bonded on. However, insulating frame 2 may also be produced in two steps, by already applying it in the course of patterning functional layer 16. After the bonding process, cap wafer 200 then just merely has to be trenched. However, this requires an alignment relative to isolation trench insulating frame 2 in functional layer 16. In both cases, dielectric layers 9 and 13, 14 act as trench stop.

Located on cap wafer 200 is a patterned metallization 5 which is in direct contact with connection area 3, but otherwise is electrically insulated from cap wafer 200 by a dielectric layer 19. Terminal pad 40 for the external contacting of the component or of functional elements 18 is situated here to the side of via 3. To that end, a rewiring was necessary, as shown, for example, in FIG. 3b.

Figure 4B:
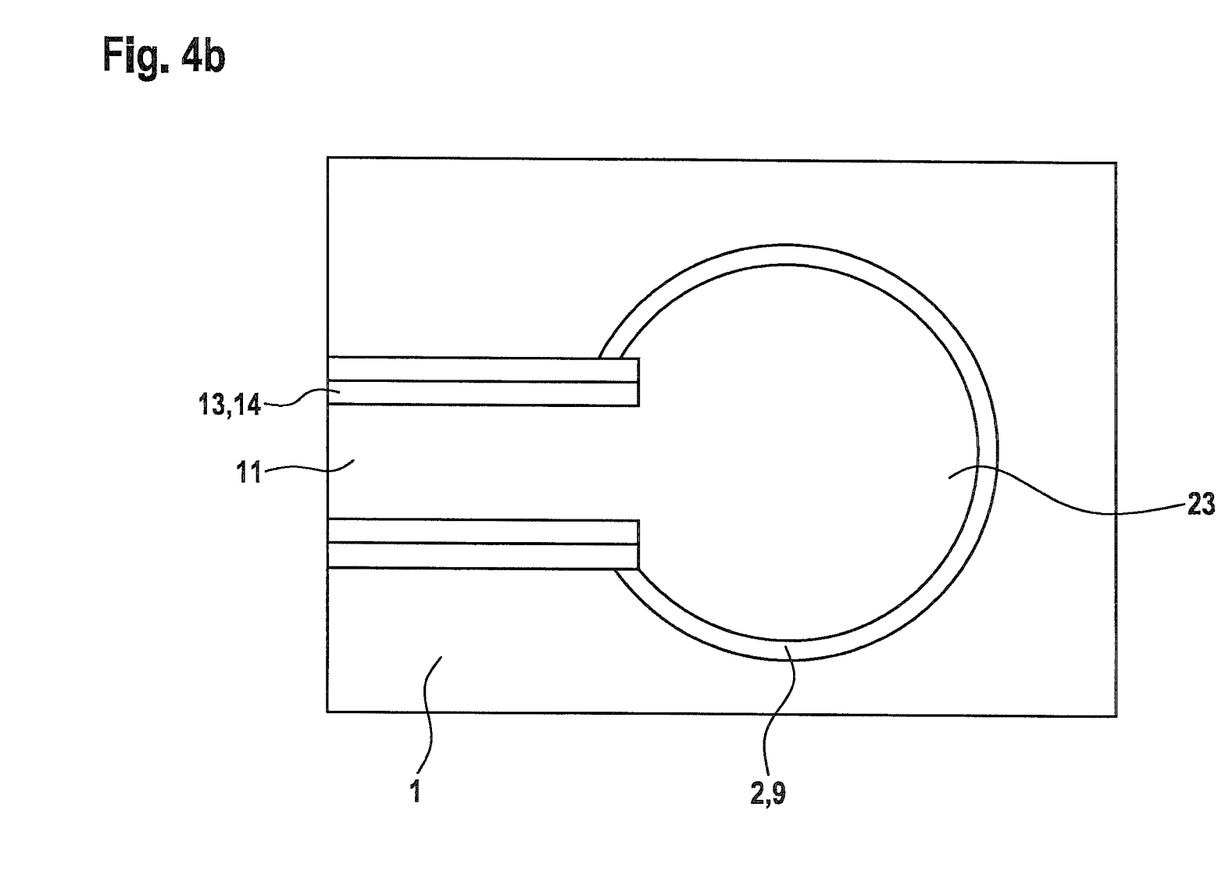
FIG. 4b shows a top view of the plane of the buried conductor track in the area of the via.

FIG. 4b illustrates the electrical contacting of micromechanical functional elements 18 of the component shown in FIG. 4a, in light of a schematic top view of the layer plane of conductive polysilicon layer 1, in which a buried conductor track 11 with connection to functional elements 18 is patterned. In the present exemplary embodiment, via 3 is surrounded by an insulating frame 2 having a ring-shaped cross section. As can be seen in FIG. 4a, insulating frame 2 extends through cap wafer 200 and functional layer 16 to next underlying dielectric layer 9 or 13, 14. In the area in which the base of insulating frame 2 is on dielectric layer 9, it isolates a circular connection area 23 from polysilicon layer 1. This connection area 23 is connected only to conductor track 11. Since dielectric layers 13, 14 are superposed on this conductor track 11, insulating frame 2 does not cut through polysilicon layer 1 here, but rather ends already on dielectric layers 13, 14.

Figure 5:
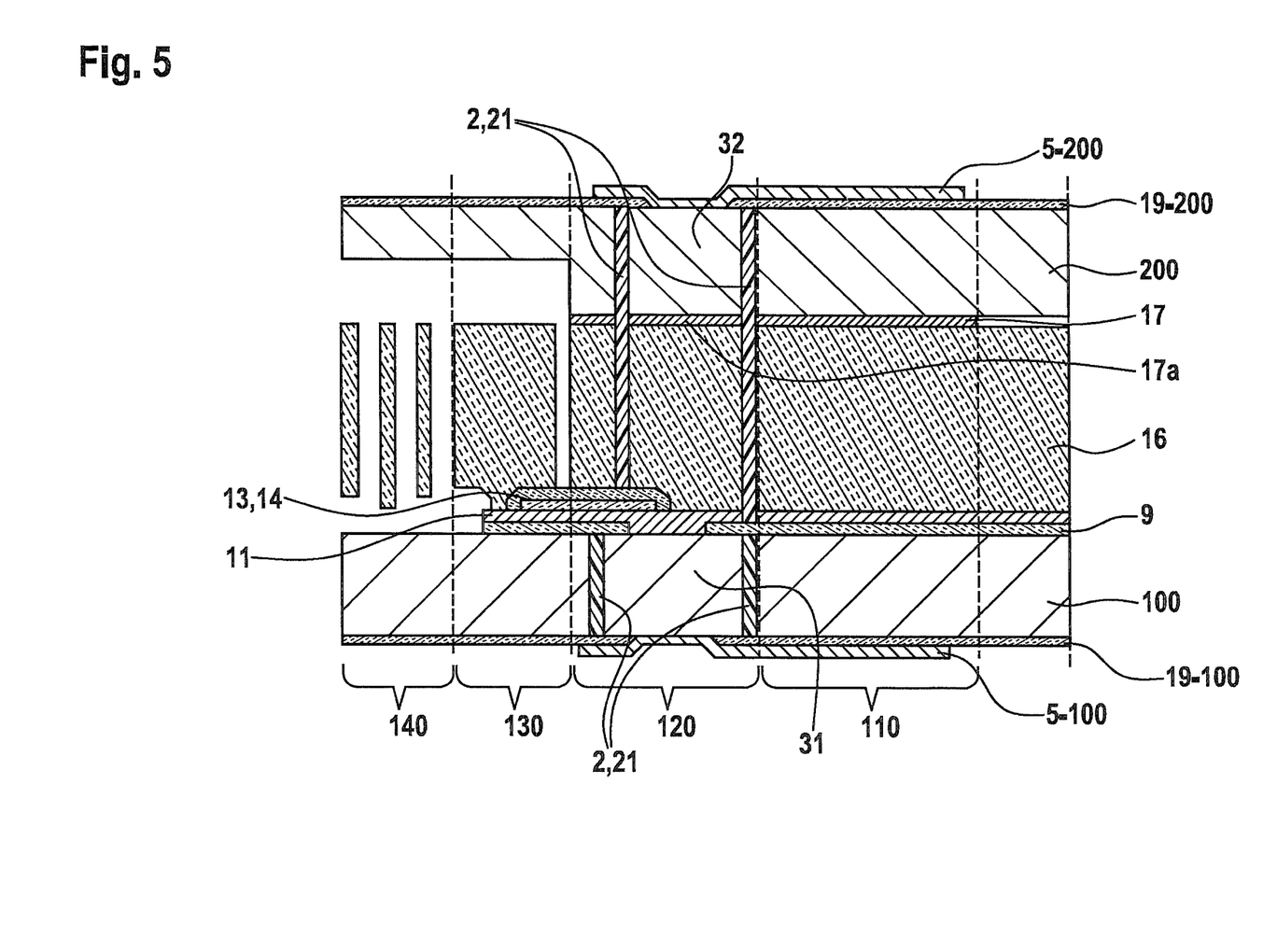
FIG. 5 shows a schematic sectional view of a further component according to the present invention, with a conductive cap wafer and connection possibilities on the top side and on the back side of the component.

The component illustrated in FIG. 5 was furnished with two vias, namely, with a via 31 in substrate 100 as shown in FIG. 2, and with a via 32 in cap wafer 200 as shown in FIG. 4a. Therefore, reference is made here to the description of FIGS. 2 and 4. In the case of this component, the sensor signal is able to be picked off both starting from the back side of the component and via cap 200. For that reason, it is particularly suitable for placement within a stack of components.

What is claimed is:

1. A method for manufacturing a component having a layer construction, starting from a semiconductor substrate, the method comprising:
   providing at least one conductor track on the semiconductor substrate, the conductor track extending laterally on a surface of the substrate and being in direct contact with at least one connection area in the substrate;
   producing at least one functional element in a functional layer provided on the conductor track, wherein the conductor track is electrically connected to the at least one functional element;
   producing, after completion of the layer construction, a trench-like insulating frame surrounding the at least one connection area of the substrate and vertically extending over the entire substrate thickness in the substrate using a back-side trenching process;
   fully filling up the trench-like insulating frame with an electrically insulating polymer; and
   applying, on the back side of the component, a patterned metallization that is connected to the connection area; and
   forming at least one terminal pad;
   wherein the connection area is electrically insulated from adjacent surrounding areas of the substrate by the trench-like insulating frame.

2. A method for manufacturing a component having a layer construction, starting from a semiconductor substrate, the method comprising:
   providing at least one conductor track on the semiconductor substrate, the conductor track extending laterally on a surface of the substrate and being in direct contact with at least one connection area in the substrate;
   producing at least one functional element in a functional layer provided on the conductor track, wherein the conductor track is electrically connected to the at least one functional element;
   producing, after completion of the layer construction, a trench-like insulating frame surrounding the at least one connection area of the substrate and vertically extending over the entire substrate thickness in the substrate using a back-side trenching process;
   fully filling up the trench-like insulating frame with an electrically insulating polymer; and
   applying, on the back side of the component, a patterned metallization that is connected to the connection area; and
   forming at least one terminal pad;
   wherein the connection area is electrically insulated from adjacent surrounding areas of the substrate by the trench-like insulating frame, and wherein the metallization is applied on the back side of the component and patterned prior to the back-side trenching process, so that the patterned metallization forms an etching mask for the back-side trenching process subsequently carried out.

3. The method of claim 1, wherein the insulating frame is expanded in at least one of a middle area and a base area by isotropic etching.

4. The method of claim 1, wherein the polymer for filling the insulating frame is applied to the back side of the substrate by spinning or spraying under vacuum conditions.

5. The method of claim 1, wherein the polymer filling is planarized by fine grinding and/or by chemical-mechanical polishing.

\* \* \* \* \*